US007528603B2

(12) United States Patent
Hayakawa

(10) Patent No.: US 7,528,603 B2
(45) Date of Patent: May 5, 2009

(54) MAGNETIC ATTRACTION PREVENTIVE SYSTEM

(75) Inventor: Hiroshi Hayakawa, Otawara (JP)

(73) Assignees: Kabushiki Kaisha Toshiba, Minato-Ku, Tokyo (JP); Toshiba Medical Systems Corporation, Otawara-Shi, Tochigi (JP)

(*) Notice: Subject to any disclaimer, the term of this patent is extended or adjusted under 35 U.S.C. 154(b) by 215 days.

(21) Appl. No.: 11/729,235

(22) Filed: Mar. 28, 2007

(65) Prior Publication Data

US 2008/0122441 A1 May 29, 2008

(30) Foreign Application Priority Data

Mar. 31, 2006 (JP) ............................ 2006-100728

(51) Int. Cl.
*G01V 3/00* (2006.01)

(52) U.S. Cl. ........................ 324/318; 324/322; 324/300

(58) Field of Classification Search ......... 324/300–322; 600/407–445; 200/228, 244, 260
See application file for complete search history.

(56) References Cited

U.S. PATENT DOCUMENTS 3,624,598 A * 11/1971 Foster ........................ 340/957
5,365,174 A * 11/1994 Yoshikata et al. ........... 324/318
5,693,913 A * 12/1997 Sudo et al. ............... 178/18.07
6,064,918 A * 5/2000 Ohtsukasa et al. ............ 700/91
6,317,693 B2 * 11/2001 Kodaka et al. .............. 701/301
2007/0132581 A1 6/2007 Molyneaux et al.

FOREIGN PATENT DOCUMENTS

JP 2006-161590 6/2006

* cited by examiner

*Primary Examiner*—Brij B Shrivastav
(74) *Attorney, Agent, or Firm*—Nixon & Vanderhye PC

(57) ABSTRACT

A magnetic attraction preventive system includes an approach detection unit which generates an approach detection magnetic field and detects the approach of a magnetic material to a magnetic resonance imaging apparatus on the basis of a variation in the strength of the approach detection magnetic field, and a preventive unit which prevents magnetic attraction of the magnetic material to the magnetic resonance imaging apparatus when the approach detection unit detects the approach of the magnetic material to the magnetic resonance imaging apparatus.

15 Claims, 7 Drawing Sheets

24b Alarm unit
211b
221b
222b
253b
Approach judgment unit
25
252b
Cancellation power supply
21b
22b
24c
Alarm unit
Detection power supply
23b Door sensor
251b
Controller
24a Alarm unit
255
254
211a
Communication unit
221a
253a
222a
Approach judgment unit
34
252a
Network
Cancellation power supply
21a
22a
251a
35
Detection power supply
Service center
23a Door sensor

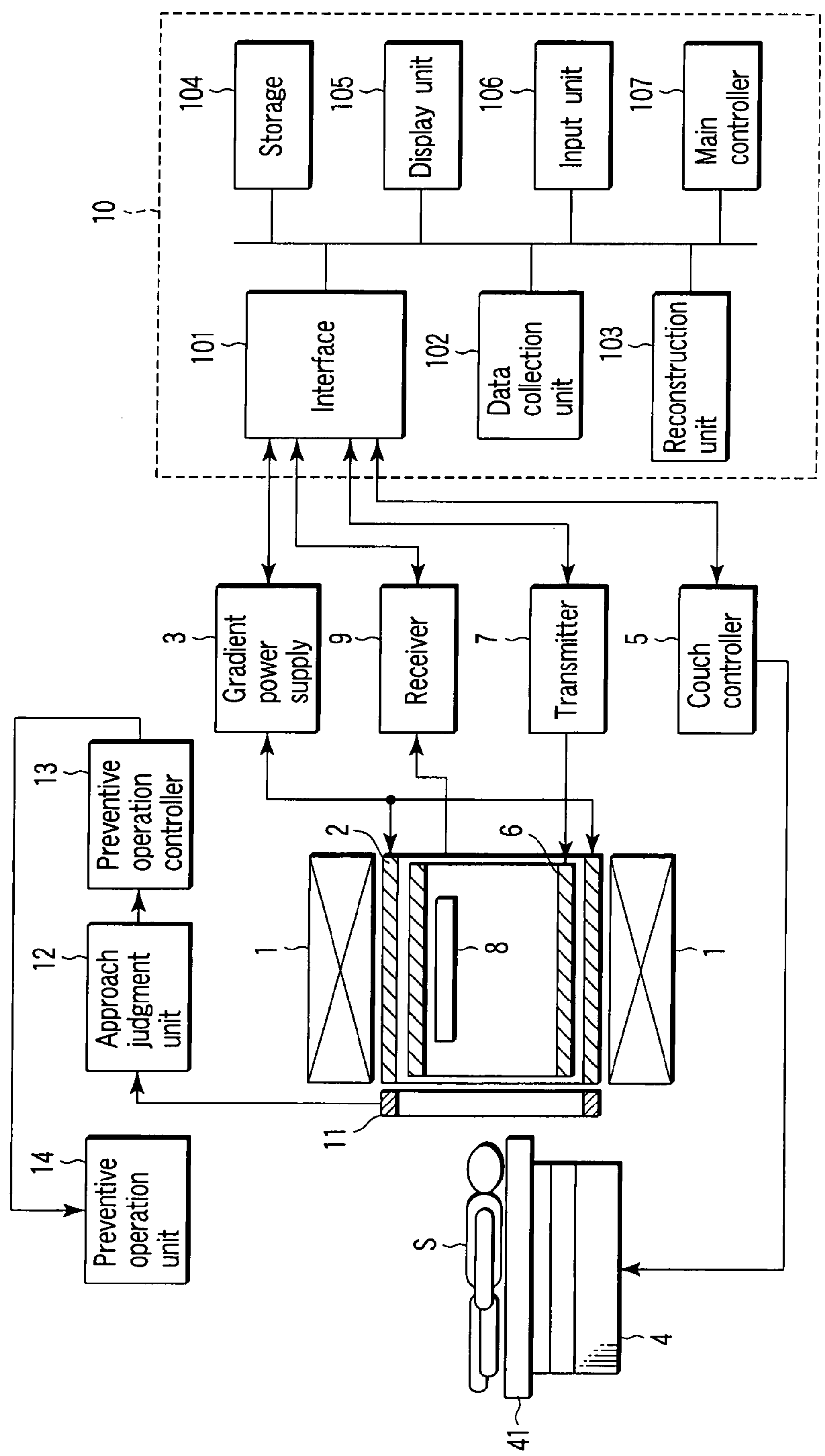
F I G. 1

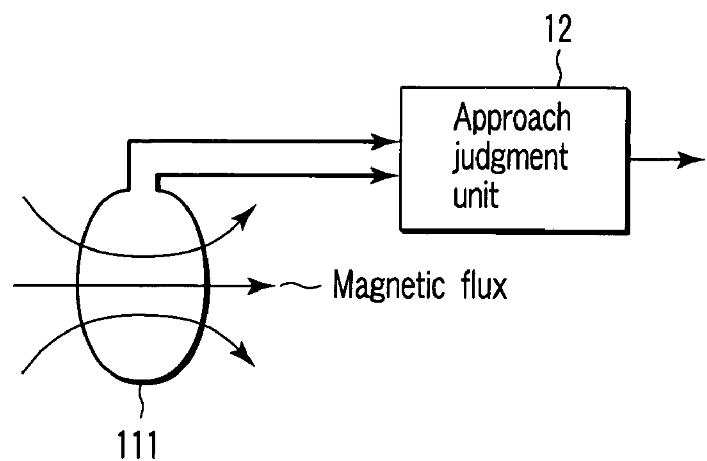
F I G. 2
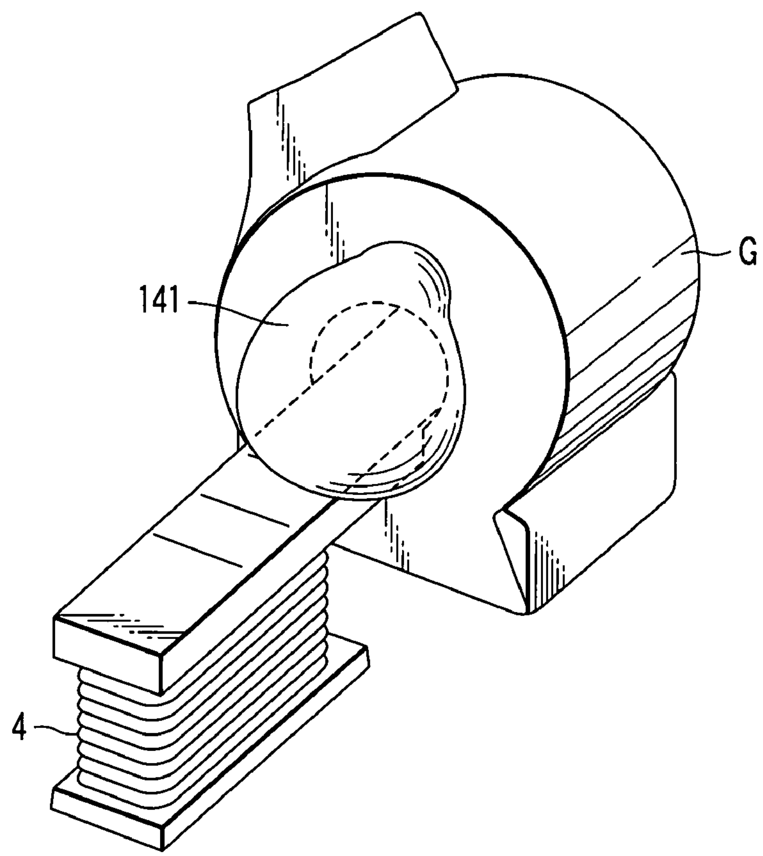
F I G. 3

MAGNETIC ATTRACTION PREVENTIVE SYSTEM

CROSS-REFERENCE TO RELATED APPLICATIONS

This application is based upon and claims the benefit of priority from prior Japanese Patent Application No. 2006-100728, filed Mar. 31, 2006, the entire contents of which are incorporated herein by reference.

BACKGROUND OF THE INVENTION

1. Field of the Invention

The present invention relates to a magnetic attraction preventive system which prevents magnetic attraction of a magnetic material to a magnetic resonance imaging apparatus which results from a magnetic field generated from the apparatus.

2. Description of the Related Art

A magnetic field generated by a magnetic resonance imaging apparatus extends to the outside of it. For this reason, so-called magnetic attraction can occur in which a magnetic material is attracted to the magnetic resonance imaging apparatus by the magnetic field.

In recent years, the magnetic fields generated by magnetic resonance imaging apparatuses have been much increased in strength. For this reason, a large object can be attracted to the apparatus or the moving speed of an object being attracted can increase. The collision of the object with the magnetic resonance imaging apparatus may cause or threaten damage to the object or the apparatus.

In view of such circumstances, in the rules of use of magnetic resonance imaging apparatus, it is laid down not to bring a magnetic material close to the apparatus. However, it is said that human errors will occur at a probability of $3\times10^{-3}$. It is therefore impossible to perfectly remove human errors. Therefore, relying on only the attention of human beings involves difficulties in preventing magnetic attraction sufficiently A technique to reduce leakage magnetic fields is disclosed in, for example, JP-A 2004-350888 (KOKAI).

BRIEF SUMMARY OF THE INVENTION

In view of such circumstances, the demand has increased for preventing the occurrence of magnetic attraction of a magnetic material to magnetic resonance imaging apparatus with certainty.

According to a first aspect of the present invention, there is provided a magnetic attraction preventive system comprising: an approach detection unit which generates an approach detection magnetic field and detects the approach of a magnetic material to a magnetic resonance imaging apparatus on the basis of a variation in the strength of the approach detection magnetic field; and a preventive unit which prevents magnetic attraction of the magnetic material to the magnetic resonance imaging apparatus when the approach detection unit detects the approach of the magnetic material to the magnetic resonance imaging apparatus.

According to a second aspect of the present invention, there is provided a magnetic attraction preventive system comprising: an approach detection unit which detects the approach of a magnetic material to a magnetic resonance imaging apparatus; a preventive unit which prevents magnetic attraction of the magnetic material to the magnetic resonance imaging apparatus when the approach detection unit detects the approach of the magnetic material; and a cancellation magnetic field generation unit which generates a cancellation magnetic field to cancel out leakage magnetic fields from the magnetic resonance imaging apparatus.

According to a third aspect of the present invention, there is provided a magnetic attraction preventive system comprising: an approach detection unit which detects the approach of a magnetic material to a magnetic resonance imaging apparatus; a preventive unit which prevents magnetic attraction of the magnetic material to the magnetic resonance imaging apparatus when the approach detection unit detects the approach of the magnetic material; and a judgment unit which judges the presence or absence of a failure in the approach detection unit on the basis of an output of the approach detection unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a schematic and block diagram of a magnetic resonance imaging apparatus according to an embodiment of the present invention;

FIG. 2 shows an arrangement of the detection coil unit in FIG. 1;

FIG. 3 is a diagram for use in explanation of the preventive operation of an air bag as the preventive operation unit in FIG. 1;

DETAILED DESCRIPTION OF THE INVENTION

Figure 4:
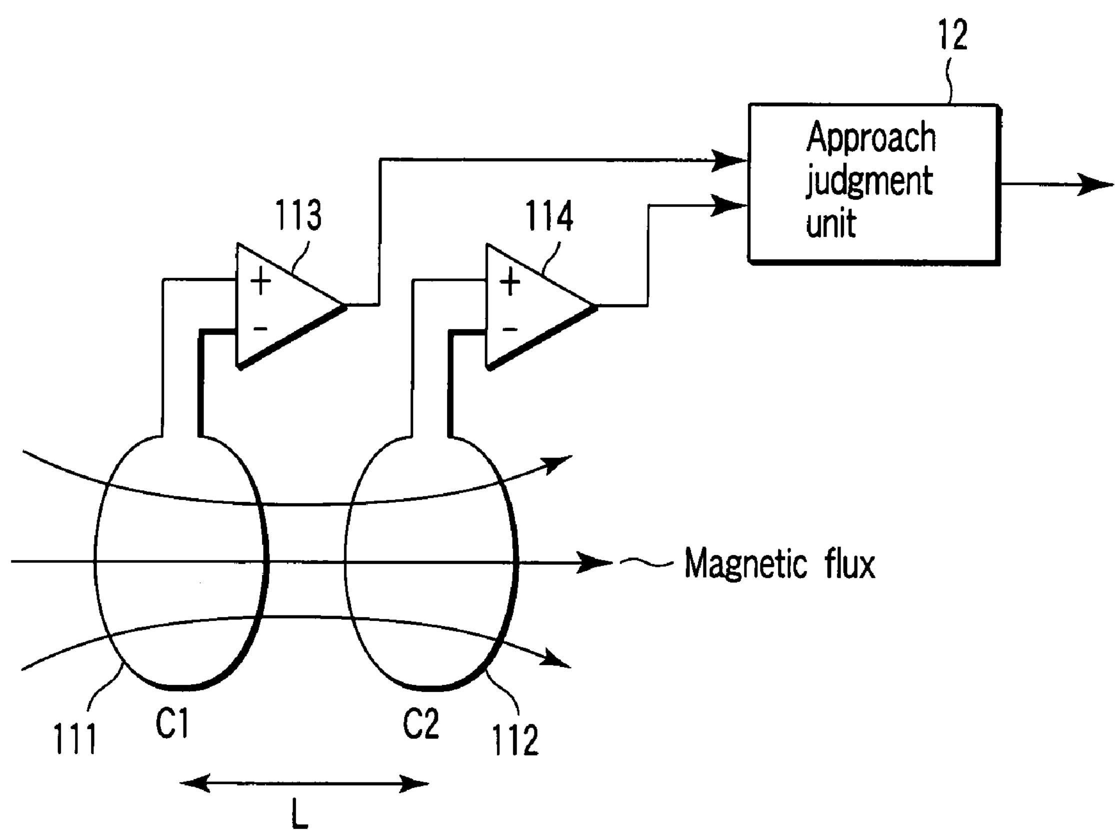
FIG. 4 shows a modification of the detection coil unit in FIG. 1.

The preferred embodiments of the present invention will be described hereinafter with reference to the accompanying drawings.

First Embodiment

FIG. 1 is a schematic and block diagram representation of a magnetic resonance imaging apparatus (hereinafter referred to as an MRI apparatus) according to a first embodiment of the present invention. This MRI apparatus shown in FIG. 1 includes a static field magnet 1, a gradient magnetic fieldgradient field coil unit 2, a gradient power supply 3, a couch 4, a couch controller 5, a transmitting RF coil unit 6, a transmitter 7, a receiving RF coil unit 8, a receiver 9, a computer system 10, a detection coil unit 11, an approach judgment unit 12, a preventive operation controller 13, and a preventive operation unit 14.

The static field magnet 1, which is formed in the shape of a hollow cylinder, generates a uniform static magnetic field in its inside space. As the static field magnet 1 use may be made of, for example, a permanent magnet or a superconducting magnet.

The gradient magnetic fieldgradient field coil unit 2 is formed in the shape of a hollow cylinder and placed inside the static field magnet 1. The gradient magnetic fieldgradient field coil unit 2 is composed of three coils each of which corresponds to a respective one of the three mutually orthogonal X, Y and Z axes. Each of the three coils in the gradient magnetic fieldgradient field coil unit 2 is separately driven by the gradient power supply 3 to generate a gradient magnetic field having its strength varied along a corresponding one of the X, Y and Z axes. Suppose, for example, that the Z-axis direction is coincident with the direction of the static magnetic field. The gradient magnetic fields in the X, Y and Z-axis directions correspond to a slice-selection gradient magnetic field Gs, a phase-encoding gradient magnetic field Ge, and a readout gradient magnetic field Gr, respectively. The slice-selection gradient magnetic field Gs is used to arbitrarily determine an imaging slice. The phase-encoding gradient magnetic field Ge is used to change the phase of a magnetic resonance signal according to spatial position. The readout gradient magnetic field Gr is used to change the frequency of the magnetic resonance signal according to spatial position.

The static field magnet 1 and the gradient field coil unit 2 are housed in a gantry, which is formed with a cavity (hereinafter referred to as an imaging space) along the inner surface of the gradient field coil unit 2.

A subject S under examination is laid down on a top board 41 of the couch 4 and moved into the imaging space. The top board 41 of the couch 4 is driven by the couch controller 5 to move in the direction of its length and in an up-and-down direction. Usually, the couch 4 is set so that the direction of its length is parallel to the central axis of the static field magnet 1.

The transmitting RF coil unit 6 has at least one coil built in and is placed inside the gradient field coil unit 2. The transmitting RF coil unit 6 receives radio-frequency pulses from the transmitter 7 to generate a radio-frequency magnetic field.

The transmitter 7 transmits radio-frequency pulses corresponding to a Lamor frequency to the transmitting RF coil unit 6.

The receiving RF coil unit 8 has at least one coil built in and is placed inside the gradient field coil unit 2. The receiving RF coil unit 8 receives a magnetic resonance signal emitted from the subject S subjected to the radio-frequency magnetic field generated by the transmitting RF coil unit 6. An output signal of the receiving RF coil unit 8 is input to the receiver 9.

The receiver 9 produces magnetic resonance signal data on the basis of the output signal of the receiving RF coil unit 8.

The computer system 10 includes an interface 101, a data collection unit 102, a reconstruction unit 103, a storage 104, a display unit 105, an input unit 106, and a main controller 107.

To the interface 101 are connected the gradient power supply 3, the couch controller 5, the transmitter 7, the receiving RF coil unit 8, and the receiver 9. The interface 101 transmits data between each of those components and the computer system 10.

The data collection unit 102 collects a digital signal output from the receiver 9 via the interface 101 and then stores the collected digital signal, i.e., magnetic resonance signal data, into the storage 104.

The reconstruction unit 103 carries out postprocessing, i.e., a reconstruction process, such as Fourier transform, on the magnetic resonance signal data stored in the storage 104 and obtains spectrum data of desired nuclear spins within the subject S under examination or image data.

The storage 104 stores magnetic resonance signal data and spectrum data or image data for each patient.

The display unit 105 displays various pieces of information, such as spectrum data or image data, under the control of the main controller 107. As the display unit 105, use may be made of a display device, such as a liquid crystal display device.

The input unit 106 accepts various instructions and information inputs by an operator. As the input unit 106, use may be made of a pointing device, such as a mouse or a trackball, a selective device, such as a mode changeover switch, or an input device, such as a keyboard.

The main controller 107, which is equipped with a CPU and a memory not shown, controls the entire MRI apparatus.

The detection coil unit 11 is formed in the shape of a ring and placed by the side of the gradient field coil unit 2. The detection coil unit 11 has a loop-like coil built in and generates a voltage induced by a magnetic field passing through the inside of that coil. The detection coil unit 11 has a single coil 111 as shown in FIG. 2, which has its both ends connected to the approach judgment unit 12. It is desired that the coil 11 be configured to have a proper sensitivity by adjusting the way to wind it, the number of turns, or the spacing of turns.

The preventive operation controller 13 causes the preventive operation unit 14 to operate in the event that a magnetic material is drawing near the gantry.

The preventive operation unit 14 performs a preventive operation of preventing magnetic attraction of that magnetic material to the gantry. As the preventive operation unit 14 use may be made of, for example, a voice reproducing device, a light emitting device, a display device, an automatic door device, an air bag device, or a magnetic field extinguishing device.

The operation of the MRI apparatus configured as described above will be described next.

The static field magnet 1 generates a magnetic field used for imaging diagnosis in its internal imaging space. The magnetic field leaks out to the outside of the imaging space. The magnetic field generated by the static field magnet 1 is a static magnetic field that will not change with time. The leakage magnetic field is also a static magnetic field. However, the approach of a magnetic material to the gantry will result in a variation in the strength of the magnetic field (magnetic flux density). A voltage generated across the coil 111 is given by $$V=-(d\Phi/dt)=-(dB/dt)\times S$$

where $d\Phi$ is the amount by which the magnetic flux passing through the coil 111 changes at time dt, dB is the amount by which the magnetic flux density in the periphery of the coil 111 changes at time dt, and S is the inside area of the coil 111.

Since the area S is constant, the voltage V will have a magnitude corresponding to dB/dt. That is, the voltage V will have a magnitude corresponding to a change in the magnetic flux density per unit time. Thus, when the voltage V exceeds a threshold value, the approach judgment unit 12 judges that a magnetic material is approaching the gantry. The threshold value is determined in consideration on the performance of the static field magnet 1 and is greater than a voltage generated by a usual change in the static magnetic field.

The preventive operation controller 13 is waiting for the approach judgment unit 12 to judge that a magnetic material is approaching. Upon judgment that a magnetic material is approaching, the preventive operation controller 13 causes the preventive operation unit 14 to perform a preventive operation. The preventive operation unit 14 then performs the preventive operation. When the preventive operation unit 14 is a voice reproducing device, the preventive operation is to output a voice message. When the preventive operation unit 14 is a light emitting device, the preventive operation is to emit light. When the preventive operation unit 14 is a display device, the preventive operation is to display a character message or icon. For example, the voice or character message is such that "Operator, the patient is carrying a magnetic material with him". When the preventive operation unit 14 is an automatic door device, the preventive operation is to shut the automatic door. The automatic door is placed at the entrance of a room in which the MRI apparatus is installed. When the preventive operation unit 14 is an air bag device, the preventive operation is to spread the air bag. For example, as shown in FIG. 3, the air bag, when it is spread, covers the aperture of the gantry G. When the preventive operation unit 14 is a magnetic field extinguishing device, the preventive operation is to extinguish the static magnetic field generated by the static field magnet 1.

The outputting of a voice message, emission of light, or display of a character message or icon can give a person a caution that he or she is bringing a magnetic material close to the MRI apparatus, thus allowing magnetic materials to be prevented from approaching the MRI apparatus. The shutting of an automatic door or spreading of an air bag allows magnetic materials to be physically prevented from further approaching the MRI apparatus. The extinguishing of the static magnetic field allows failure of magnetic attraction to occur even if a magnetic material is brought close to the MRI apparatus. These means allow the occurrence of magnetic attraction to be prevented with higher certainty than ever before.

Second Embodiment

Figure 5:
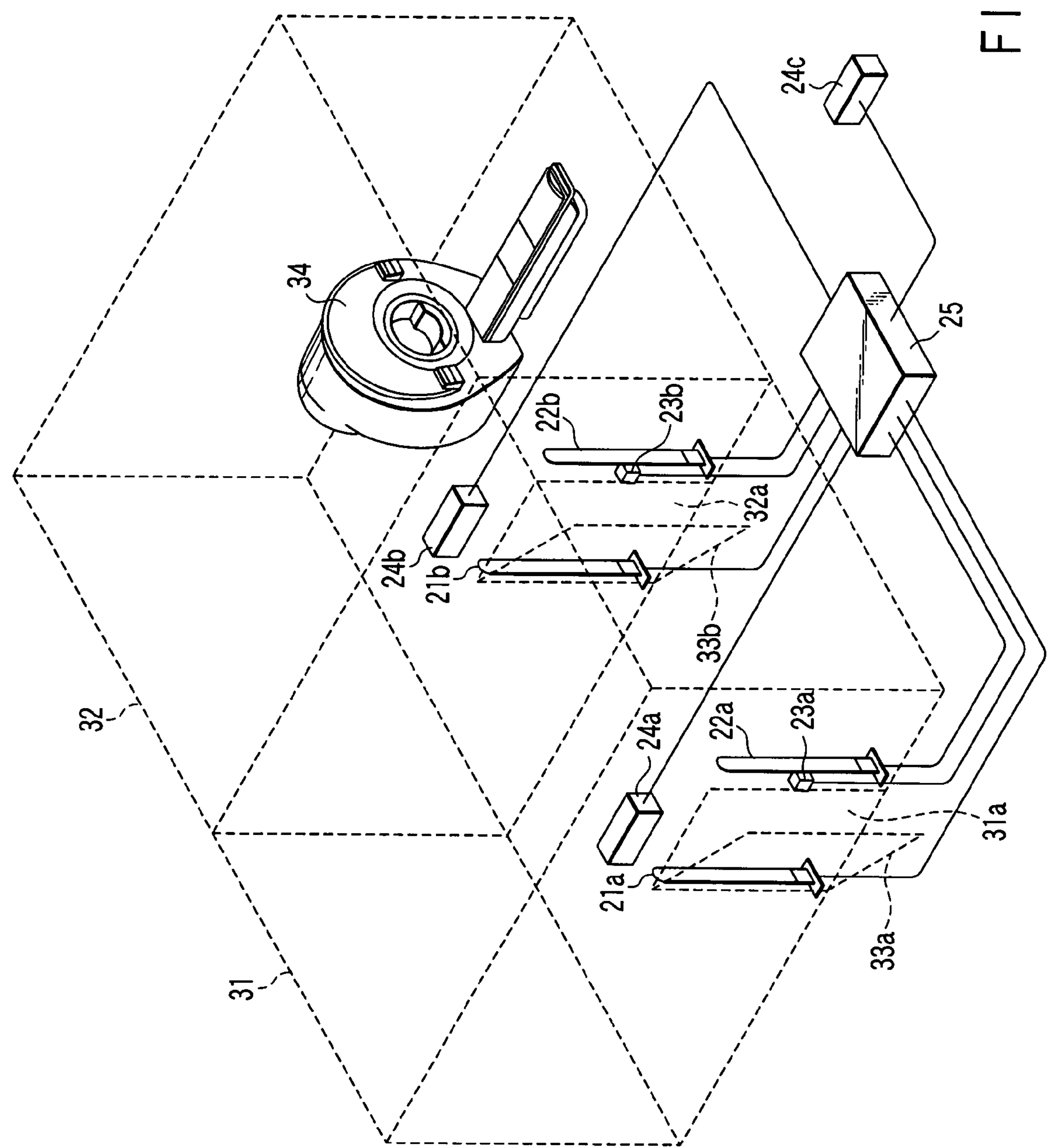
FIG. 5 is a schematic perspective view of a magnetic attraction preventive system according to a second embodiment of the present invention.

FIG. 5 is a schematic perspective view of a magnetic attraction preventive system according to a second embodiment of the present invention. The magnetic attraction preventive system shown in FIG. 5 includes coil units 21*a*, 21*b*, 22*a*, and 22*b*, door sensors 23*a* and 23*b*, alarm units 24*a*, 24*b*, and 24*c*, and a main unit 25.

The coil units 21*a* and 22*a*, door sensor 23*a* and alarm unit 24*a* are each placed in the vicinity of an entrance/exit (hereinafter referred to simply as an entrance) 31*a* of a front room 31. The coil units 21*b* and 22*b*, door sensor 23*b* and alarm unit 24*b* are each placed in the vicinity of an entrance 32*a* of a examination room 32. The alarm unit 24*c* and main unit 25 are placed in, for example, an operation room (not shown).

More specifically, the coil units 21*a* and 22*a* are placed on the wall or the floor of the front room 31 so as to face each other with the entrance 31*a* interposed therebetween. The door sensor 23*a* is mounted on the wall of the front room 31 so as to face the entrance 31*a*. The alarm unit 24*a* is mounted on the wall of the front room 31 above the entrance 31*a*. The coil units 21*b* and 22*b* are placed on the wall or the floor of the examination room 31 so as to face each other with the entrance 32*a* interposed therebetween. The door sensor 23*b* is mounted on the wall of the examination room 32 so as to face the entrance 32*a*. The alarm unit 24*b* is mounted on the wall of the front room 31 above the entrance 32*a*. The coil units 21*b* and 22*b*, door sensor 23*b* and alarm unit 24*b* are respectively set in the same manner as the coil units 21*a* and 22*a*, door sensor 23*a* and alarm unit 24*a*, except locations where they are placed.

The coil units 21*a* and 22*a* or coil units 21*b* and 22*b* may be mounted on the wall of the corresponding room, embedded in the wall of the corresponding room, or embedded in the door frame of the corresponding room. In addition, the coil units 21*a* and 22*a* or coil units 21*b* and 22*b* may be configured and placed so that a person passing through the entrance 31*a* or 32*a* will pass through them.

Each of the door sensors 23*a* and 23*b* detects the opening and closing of a corresponding one of the doors 33*a* and 33*b* respectively attached to the entrances 31*a* and 32*a*.

The alarm units 24*a*, 24*b* and 24*c* perform an alarm operation of outputting a voice message, emitting light, or displaying a character message or icon.

The examination room 32 is equipped with an MRI apparatus 34 and used for imaging diagnosis by that apparatus. The front room 31 is a room used for a patient to be examined to prepare for examination.

Figure 6:
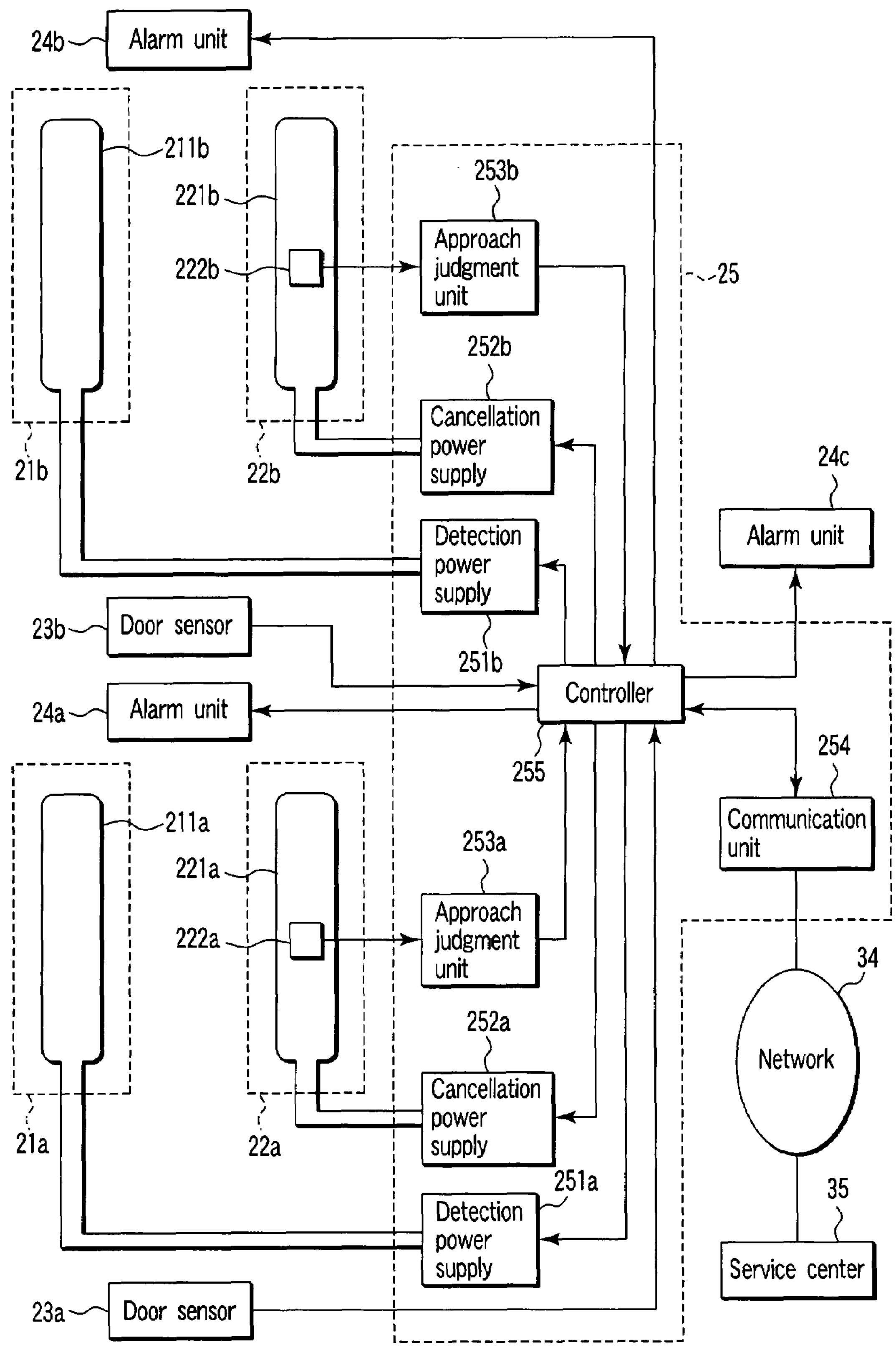
FIG. 6 is a detailed block diagram of the magnetic attraction preventive system shown in FIG. 5.

FIG. 6 is a detailed block diagram of the magnetic attraction preventive system shown in FIG. 5.

The coil units 21*a*, 21*b*, 22*a* and 22*b* have built-in coils 211*a*, 211*b*, 221*a*, and 221*b*, respectively. The coil units 22*a* and 22*b* have built-in magnetic detectors 222*a* and 222*b*, respectively. Note that the magnetic detectors 222*a* and 222*b* may be built in the coil units 21*a* and 21*b*, respectively.

Each of the coil units 211*a*, 211*b*, 221*a* and 221*b* generates a magnetic field upon receiving a current from the main unit 25.

The magnetic detectors 222*a* and 222*b* each detect a magnetic field to output a detection signal having a level corresponding to the strength of that magnetic field. As each of the magnetic detectors 222*a* and 222*b*, use may be made of a known device, such as a thin-film flux gate magnetic sensor, a gauss meter (Hall element), a magnetoresistive element, or a magnetic diode.

The main unit 25 includes detection power supplies 251*a* and 251*b*, cancellation power supplies 252*a* and 252*b*, approach judgment units 253*a* and 253*b*, a communication unit 254, and a controller 255.

Each of the detection power supplies 251*a* and 251*b*, which are connected to the coils 221*a* and 221*b*, respectively, provides a control current to a corresponding one of the coils to cause it to generate a magnetic field.

The magnetic field generated by the coils 211*a* and 211*b* serves to improve the detection accuracy by ensuring detection of approach of a magnetic material not dependent upon the leakage magnetic field.

Each of the cancellation power supplies 252*a* and 252*b*, which are connected to the coils 221*a* and 221*b*, respectively, supplies a cancellation current to a corresponding one of the coils to cause it to generate a cancellation magnetic field.

The cancellation magnetic field prevents the magnetic detectors 222*a* and 222*b* from being saturated by the leakage magnetic field, thereby ensuring reliable detection of approach of a magnetic material.

Each of the approach judgment units 253*a* and 253*b*, which are connected to the magnetic detectors 222*a* and 222*b*, respectively, judges the presence or absence of approach of a magnetic material on the basis of an output signal from a corresponding one of the magnetic detectors.

The communication unit 254 performs a process to allow the controller 255 to communicate over a network 34 with a service center 35.

The controller 255 has the door sensors 23*a* and 23*b*, alarm units 24*a*, 24*b* and 24*c*, detection power supplies 251*a* and 251*b*, cancellation power supplies 252*a* and 252*b*, approach judgment units 253*a* and 253*b*, and communication unit 254 connected to it. The controller controls the alarm units 24*a*, 24*b* and 24*c*, detection power supplies 251*a* and 251*b*, and cancellation power supplies 252*a* and 252*b* in accordance with the results of detection by the door sensors 23*a* and 23*b* and results of judgment by the approach judgment units 253*a* and 253*b*.

The operation of the magnetic attraction preventive system thus configured will be described next.

In a normal mode, the controller 255 performs a process of watching carrying-in of a magnetic material for each of the front room 31 and the examination room 32. Here, the operation will be described in detail taking a process of watching a magnetic material being brought into the front room 31 by way of example.

Figure 7:
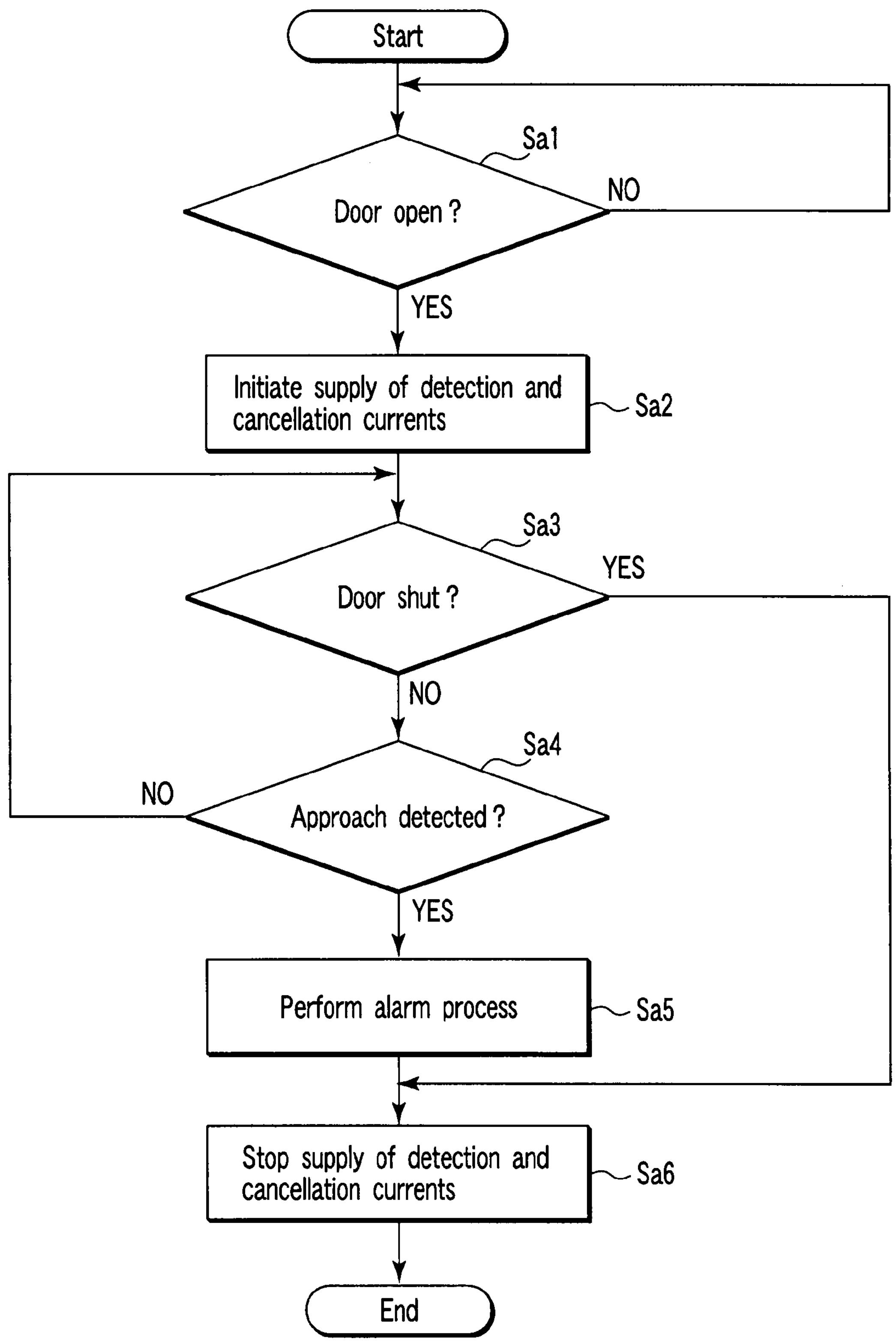
FIG. 7 is a flowchart illustrating the process of the controller in FIG. 1 to watch carrying-in of a magnetic material.

FIG. 7 is a flowchart illustrating the process of the controller 255 to watch carrying-in of a magnetic material.

In step Sa1, the controller 255 waits for the door sensor 23*a* to detect opening of the door 33*a*. When the door sensor 23*a* detects opening of the door 33*a*, the controller 255 goes from step Sa1 to step Sa2.

In step Sa2, the controller 255 instructs the detection power supply 251*a* and/or cancellation power supply 252*a* to initiate the supply of a detection current and/or a cancellation current. In response to this instruction, the detection power supply 251*a* and cancellation power supply 252*a* initiate the supply of the detection and cancellation currents. The detection current is a direct current that causes the coil 211*a* to generate a magnetic field for detecting the approach of a magnetic material. The magnitude of the detection current is set so as to allow the coil 211*a* to generate a detection magnetic field which covers the entrance 31*a*, the periphery of the entrance 31*a* and extends to the magnetic detector 222*a*. The cancellation current is a current that causes the coil 221*b* to generate a cancellation magnetic field for canceling a leakage magnetic field from the MRI apparatus and extends to the magnetic detector 222*a*. The proper magnitude and polarity of the cancellation current will vary according to the magnitude of influence and the direction of the leakage magnetic field from the MRI apparatus. For this reason, the proper magnitude and polarity of the cancellation current are set in advance according to the strength and direction of the leakage magnetic field measured in the vicinity of the magnetic detector 222*a* at the time, for example, the magnetic attraction preventive system is installed.

Thus, when the door 33*a* is open, the leakage magnetic field from the MRI apparatus 34 is canceled out in the entrance 31*a* and the periphery of the entrance 31*a*, keeping the magnetic detector 222*a* free from magnetic saturation. The detection magnetic field is detected by the magnetic detector 222*a*, the result of detection being provided to the approach judgment unit 253*a* as a detection signal having a level corresponding to the strength of the detection magnetic field. When the amount by which the detection signal level varies is not more than a predetermined reference value, the approach judgment unit 253*a* judges that no magnetic material is approaching. However, when a magnetic material is being carried through the entrance 31*a* into the front room 31, the detection magnetic field is greatly varied and consequently the level of the detection signal varies greatly. When the amount by which the detection signal level varies increases above the reference value, the approach judgment unit 253*a* judges that a magnetic material has approached.

The cancellation magnetic field needs only to reduce the effect of the leakage magnetic field in the vicinity of the magnetic detector 222*a* or 222*b*. In other words, the cancellation magnetic field is only required to prevent the magnetic detectors 222*a* and 222*b* from being saturated by the leakage magnetic field. On the other hand, the detection magnetic field needs to be formed to cover at least the periphery of the entrance 31*a* or 32*a* in order to secure an area where the approach of a magnetic material can be detected without being affected by the leakage magnetic field. For this reason, as shown in FIG. 6, it is reasonable to place the coils 221*a* and 221*b* closer to the magnetic detectors 222*a* and 222*b* than the coils 211*a* and 211*b*, respectively. Thus, since the required coverage differs between the detection and cancellation magnetic fields, it is also possible to make the coils 221*a* and 221*b* smaller than coils 211*a* and 211*b*.

In steps Sa3 and Sa4, the controller 255 waits for closing of the door 33*a* or for the approach judgment unit 253*a* to judge that a magnetic material has approached. If the approach judgment unit 253*a* judges that a magnetic material has approached, then the controller 255 goes from step Sa4 to step Sa5. In step Sa5, the controller 255 carries out an alarm process to operate at least one of the alarm units 24*a* and 24*c*. When the alarm unit 24*a* is operated, a person who has carried a magnetic material into the front room or a person who has already entered the front room will be notified that a magnetic material has been carried into the front room. When the alarm unit 24*c* is operated, a operator in the operation room will be notified that a magnetic material has been carried into the front room. The alarm process may be performed for a fixed time or continuously until the approach judgment unit 253*a* comes to judge that no magnetic material approaches.

Upon termination of the alarm process, the controller 255 goes to step Sa6. If the door 33*a* is shut without judgment that a magnetic material has approached, then the controller 255 goes from step Sa3 to step Sa6. In step Sa6, the controller 255 instructs the detection power supply 251*a* and cancellation power supply 252*a* to stop the supply of the detection and cancellation currents. In response to this instruction, the detection power supply 251*a* and cancellation power supply 252*a* stop the supply of the detection and cancellation currents.

Upon termination of step Sa6, the controller 255 temporarily completes the process shown in FIG. 7. As long as the normal operation mode is set, however, the controller immediately resumes the process shown in FIG. 7.

When a test mode is set, the controller 255 performs an operation testing process for each of the front room 31 and examination room 32. Here, the process will be described in detail taking an operation testing process on the examination room 32 by way of example. The test mode may be set either manually by an operator or customer engineer or automatically by the controller 255 at the time the magnetic attraction system or MRI apparatus 34 is started or at regular intervals.

Figure 8:
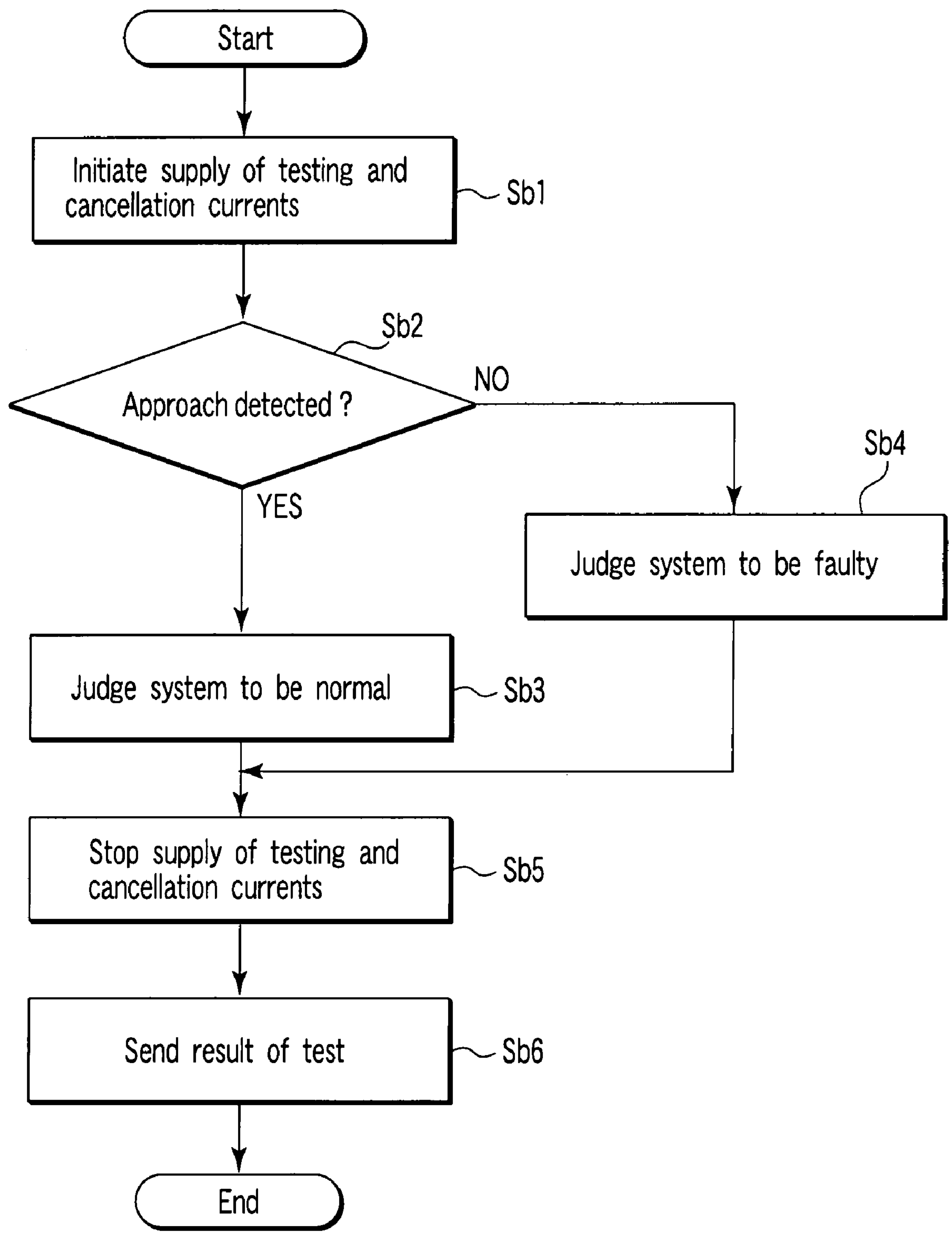
FIG. 8 is a flowchart illustrating the process of the controller of FIG. 1 to make an operation test.

FIG. 8 is a flowchart illustrating the process of the controller 255 to make an operation test.

In step Sb1 the controller 255 instructs the detection power supply 251*b* and cancellation power supply 252*b* to initiate the supply of a testing current and a cancellation current. In response to this instruction, the detection power supply 251*b* and cancellation power supply 252*b* initiate the supply of the testing and cancellation currents. The testing current is a current that causes the coil 211*b* to generate a testing magnetic field which will vary in strength as is the case with the detection magnetic field when a magnetic material has approached. Therefore, the testing current is a direct current the magnitude of which varies.

Thus, if the detection power supply 251*b*, coil 211*b*, magnetic detector 222*b* and approach judgment unit 253*b* are all working normally, the approach judgment unit should detect as if a magnetic material has approached.

In step Sb2, therefore, the controller 255 confirms whether or not the approach judgment unit 253*b* has judged as if a magnetic material has approached. If the approach judgment unit 253*b* has judged as if a magnetic material has approached, then the controller 255 goes from step Sb2 to step Sb3 to determine that the system is normal. However, if the approach judgment unit 253*b* has judged that no magnetic material has approached, then the controller 255 goes from step Sb2 to step Sb4 to determine that the system is faulty.

The controller 255 goes from step Sb3 or Sb4 to step Sb5. In step Sb5, the controller 255 instructs the detection power supply 251*b* and cancellation power supply 252*b* to stop the supply of the testing and cancellation currents. In response to this instruction, the detection power supply 251*b* and cancellation power supply 252*b* stop the supply of the testing and cancellation currents.

In step Sb6, the controller 255 performs a process of sending test result information containing the above result of judgment to a predetermined location. If the location to which the test result information is to be sent is the service center 35, then the controller 255 sends the test result information to the service center 35 over the network 34. The location to which the test result information is to be sent may be that console of the MRI apparatus 34 which is installed in an operation room. Alternatively, the main unit 25 may be equipped with a display device to display the contents of the test result information.

According to the second embodiment, as described above, since the approach of a magnetic material is detected on the basis of variations in the strength of a detection magnetic field generated by the coil 211*a* or 211*b*, the detection accuracy is improved in comparison with the first embodiment using a leakage magnetic field.

In addition, according to the second embodiment, the leakage magnetic field is canceled out. Therefore, even in a place where the leakage magnetic field is strong, the magnetic detectors 222*a* and 222*b* are prevented from being saturated by the leakage magnetic field, allowing the approach of a magnetic material to be detected properly.

According to the second embodiment, in the event that a magnetic material is approaching a detection magnetic field, the persons concerned are notified to that effect through the alarm units 24*a*, 24*b* and 24*c*. As a result, they are cautioned not to bring the magnetic material even closer to the MRI apparatus 34, thus allowing the occurrence of magnetic attraction to be prevented.

Furthermore, according to the second embodiment, by using a magnetic field generated by the coil 211*a* or 211*b* as a testing magnetic field with a varying strength, a test can be made with ease as to whether or not the approach of a magnetic material can be detected normally.

Moreover, the second embodiment is configured to detect the approach of a magnetic material at both the entrance 31*a* of the front room and the entrance 32*a* of the examination room. This two-stage detection (i.e., two-stage alarm operation) allows the attraction of a magnetic material to the MRI apparatus 34 to be prevented with more certainty. In some cases, the effect of the alarm can be enhanced by providing a variation between the two alarm operations. For example, when the approach of a magnetic material is detected at the entrance 31*a* of the front room, the alarm is sounded with such a moderate volume as awakens the attention of the persons concerned. On the other hand, if the approach of a magnetic material is detected at the entrance 32*a* of the examination room, the alarm is sounded with such a great volume as gives the persons concerned a strong warning.

In addition, the second embodiment is configured to generate the detection and cancellation magnetic fields only when there is a possibility of approach of a new magnetic material as when the door 31*a* or 32*a* is open, thus preventing these magnetic fields having an influence on imaging by the MRI apparatus 34.

Various modifications of the first and second embodiments are possible as follows:

In the first embodiment, the detection coil unit 11 may be equipped with a coil 112 in addition to the coil 111 as shown in FIG. 4. The coil 112, which may be opposite in the direction of winding to the coil 111, is placed apart from the coil 111 along the direction of the static magnetic field. The coil 111 has its ends connected to the inputs of a differential amplifier 113. The coil 112 has its ends connected to the inputs of a differential amplifier 114. The outputs of the differential amplifiers 113 and 114 are connected to the approach judgment unit 12. The approach judgment unit 12 weights the output voltages of the differential amplifiers 113 and 114 in accordance with the spacing L of the coils 111 and 112 and then adds or subtracts the weighted voltages together, thereby judging whether or not a magnetic material is approaching on the basis of a variation in the sum of the weighted voltages. This makes it possible to selectively measure a variation in the nearby magnetic field.

The first embodiment may be equipped with more than one preventive operation unit 14. In this case, each of the multiple preventive operation units may perform the same preventive operation or a different preventive operation. For example, two or more identical display devices may be set up as the preventive operation units 14. Or a voice reproducing device and an automatic door device may be set up as the preventive operation units 14. In this case, the preventive operation units 14 may be configured to perform a preventive operation at the same time or at different times. For example, it is possible to first give the persons concerned a caution for the approach of a magnetic material through the voice reproducing device and then shut the automatic door when the magnetic material further approaches. This allows effective two-stage prevention of magnetic attraction.

In the first embodiment, the approach of a magnetic material may be detected by a different method. For example, a magnetic field generator may be set up which generates a detection magnetic field different from the magnetic fields for diagnosis, in which case the approach of a magnetic material is detected on the basis of a variation in that detection magnetic field.

The first embodiment may be configured to prevent magnetic attraction of a magnetic material even while gradient magnetic fields are being generated by considering the conditions of the gradient magnetic fields in order to detect the magnetic material.

The first embodiment may be configured such that the detection coil unit 11, approach judgment unit 12, preventive operation controller 13 and preventive operation unit 14 are separated from the MRI apparatus to thereby implement a standalone magnetic attraction preventive system.

In the second embodiment, the detection magnetic field may be generated at all times irrespective of the states of the doors 33*a* and 33*b*. Also, the timing of generating the detection magnetic field may be determined on the basis of an output signal of a different sensor, such as an infrared sensor, which detects the approach of a human being.

In the second embodiment, in addition to or instead of the alarm operation, the automatic door 33*a* or 33*b* may be shut automatically or the air bag set up in the MRI apparatus 34 in the first embodiment may be spread. For example, if, when the approach of a magnetic material is detected at the entrance 31*a*, the door 33*b* is shut automatically or locked, magnetic attraction to the MRI apparatus 34 will be prevented with the highest certainty.

In the second embodiment, as in the first embodiment, sensors utilizing variations in current induced in a coil may be used instead of using the magnetic detectors 222*a* and 222*b*.

In the second embodiment, each of the magnetic detectors 222*a* and 222*b* may be increased in number in order to provide for their failure.

In the second embodiment, an alternating current may be used as the detection current. In this case, since the strength of the detection magnetic field varies with a constant period, the approach of a magnetic material can be detected by monitoring a variation synchronized with the variation frequency. In this case, by filtering components of frequencies greatly differing from the variation frequency, the approach of a magnetic material can be detected with high accuracy without being affected by other magnetic fields which greatly differ in variation frequency from the detection magnetic field or by electrical noise.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic attraction preventive system comprising:

an approach detection unit which generates an approach detection magnetic field and detects the approach of a magnetic material to a magnetic resonance imaging apparatus on the basis of a variation in the strength of the approach detection magnetic field;

a preventive unit which prevents magnetic attraction of the magnetic material to the magnetic resonance imaging apparatus when the approach detection unit detects the approach of the magnetic material to the magnetic resonance imaging apparatus; and a cancellation magnetic field generation unit which generates a cancellation magnetic field to cancel out leakage magnetic fields which are generated by the magnetic resonance imaging apparatus and extends to an area where the approach detection unit detects the approach detection magnetic field.

2. The magnetic attraction preventive system according to claim 1, wherein the preventive unit is adapted to prevent magnetic attraction of the magnetic material to the magnetic resonance imaging apparatus by at least one of the operations of making a warning, interposing an obstacle between the magnetic resonance imaging apparatus and the magnetic material, and extinguishing magnetic fields generated by the magnetic resonance imaging apparatus.

3. The magnetic attraction preventive system according to claim 2, wherein the warning is made through at least one of the operations of producing a warning sound, producing a warning light, and displaying a warning message.

4. The magnetic attraction preventive system according to claim 1, wherein the preventive unit continues the operation of preventing magnetic attraction of the magnetic material to the magnetic resonance imaging apparatus until the approach of the magnetic material to the magnetic resonance imaging apparatus becomes undetected by the approach detection unit.

5. A magnetic attraction preventive system an approach detection unit which generates an approach detection magnetic field and detects the approach of magnetic material to a magnetic resonance imaging apparatus on the basis of a variation in the strength of the approach detection magnetic field;

a preventive unit which prevents magnetic attraction of the magnetic material to the magnetic resonance imaging apparatus when the approach detection unit detects the approach of the magnetic material to the magnetic resonance imaging apparatus; and wherein the approach detection unit includes at least one detection module which includes a detection magnetic field generating unit which generates the approach detection magnetic field, a magnetic field strength detection unit which detects the strength of the approach detection magnetic field generated by the detection magnetic field generating unit, and a judgment unit which judges whether or not the magnetic material has approached the magnetic resonance imaging apparatus on the basis of a variation in the strength of the approach detection magnetic field detected by the magnetic field detection unit.

6. The magnetic attraction preventive system according to claim 5, wherein the detection magnetic field generating unit includes a coil, and a supply unit which supplies the coil with a control current to cause the coil to generate the approach detection magnetic field.

7. The magnetic attraction preventive system according to claim 6, wherein the control current is a direct current.

8. The magnetic attraction preventive system according to claim 6, wherein the control current is an alternating current.

9. The magnetic attraction preventive system according to claim 5, wherein the detection module detects the approach of a magnetic material to the magnetic resonance imaging apparatus through a first entrance set between an examination room in which the magnetic resonance imaging apparatus is installed and a front room next to the examination room.

10. The magnetic attraction preventive system according to claim 9, further comprising a controller which controls the detection module to initiate a detection operation in response to an operation of a door set at a second entrance of the front room.

11. The magnetic attraction preventive system according to claim 5, wherein said at least one detection module includes two detection modules, one of the two detection modules detecting the approach of a magnetic material to the magnetic resonance imaging apparatus through a first entrance set between an examination room in which the magnetic resonance imaging apparatus is installed and a front room next to the examination room, and another one of the two detection modules detecting the approach of the magnetic material to the magnetic resonance imaging apparatus through a second entrance of the front room.

12. The magnetic attraction preventive system according to claim 5, wherein the detection magnetic field generating unit has a function of changing the strength of the approach detection magnetic field in a test mode, and further comprises a failure detection unit which detects a failure in the detection module on the basis of a variation in the strength of the magnetic field detected by the magnetic field detection unit in the test mode.

13. The magnetic attraction preventive system according to claim 12, further comprising a transmission unit which sends information indicating the results of detection by the failure detection unit to a remote service center or the magnetic resonance imaging apparatus.

14. A magnetic attraction preventive system comprising:

an approach detection unit which detects the approach of a magnetic material to a magnetic resonance imaging apparatus;

a preventive unit which prevents magnetic attraction of the magnetic material to the magnetic resonance imaging apparatus when the approach detection unit detects the approach of the magnetic material to the magnetic resonance imaging apparatus; and a cancellation magnetic field generation unit which generates a cancellation magnetic field to cancel out leakage magnetic fields from the magnetic resonance imaging apparatus.

15. A magnetic attraction preventive system comprising:

an approach detection unit which detects the approach of a magnetic material to a magnetic resonance imaging apparatus;

a preventive unit which prevents magnetic attraction of the magnetic material to the magnetic resonance imaging apparatus when the approach detection unit detects the approach of the magnetic material to the magnetic resonance imaging apparatus; and a judgment unit which judges the presence or absence of a failure in the approach detection unit on the basis of an output of the approach detection unit.

* * * * *